United States Patent
Usami et al.

[11] Patent Number: 5,939,771
[45] Date of Patent: Aug. 17, 1999

[54] SEMICONDUCTOR DEVICE HAVING AN ORGANIC RESIN LAYER AND SILICON OXIDE LAYER CONTAINING FLUORINE FOR PREVENTING CROSSTALK BETWEEN METAL LINES AND A METHOD OF MANUFACTURING THE SAME

[75] Inventors: Tatsuya Usami; Tetsuya Homma, both of Tokyo, Japan

[73] Assignee: NEC Corporation, Tokyo, Japan

[21] Appl. No.: 08/739,746

[22] Filed: Oct. 29, 1996

[30] Foreign Application Priority Data

Oct. 30, 1995 [JP] Japan ..................... 7-281602

[51] Int. Cl.⁶ .................................. H01L 23/532
[52] U.S. Cl. ............................ 257/643; 257/759
[58] Field of Search .................... 257/642, 643, 257/759

[56] References Cited

U.S. PATENT DOCUMENTS

| | | | |
|---|---|---|---|
| 5,486,493 | 1/1996 | Jeng | 437/195 |
| 5,512,775 | 4/1996 | Cho | 257/522 |
| 5,521,424 | 5/1996 | Ueno et al. | 257/632 |
| 5,571,571 | 11/1996 | Musaka et al. | 427/574 |
| 5,578,531 | 11/1996 | Kodera et al. | 437/228 |
| 5,616,959 | 4/1997 | Jeng | 257/759 |

FOREIGN PATENT DOCUMENTS

| | | |
|---|---|---|
| 0680085 | 11/1995 | European Pat. Off. . |
| 0700087 | 3/1996 | European Pat. Off. . |
| 62-268144 | 11/1987 | Japan ..................... 257/759 |
| 5-275551 | 10/1993 | Japan . |
| 7-074245 | 3/1995 | Japan . |

OTHER PUBLICATIONS

IBM Technical Disclosure Bulletin, vol. 34, No. 9, Feb. 1992, p. 220.

Japanese Final Office Action, mailed Mar. 18, 1998, in corresponding JPA No. 281602/1995 (translation of relevancy submitted herewith).

*Primary Examiner*—David B. Hardy
*Attorney, Agent, or Firm*—Sughrue, Mion, Zinn, Macpeak & Seas, PLLC

[57] ABSTRACT

On manufacturing a semiconductor device, preparation is made of an organic layer (101) of a resin which has a relative dielectric constant between 1.8 and 3.5, both inclusive, and which is selected from the group consisting of a polyimide resin and a fluororesin. The organic layer has a slit. A first metal (105) is buried in the slit. A silicon oxide layer (106) containing fluorine is formed on the organic layer so that the silicon oxide layer has a hole on the first metal. A second metal (107) is buried in the hole. Preferably, an additional organic layer (101') of the resin is formed on the silicon oxide layer so that the additional organic layer has an additional slit on the second metal. In this case, a first additional metal (105') is buried in the additional slit. In addition, an additional silicon oxide layer (106') containing fluorine may be formed on the additional organic layer so that the additional silicon oxide layer has an additional hole on the first additional metal. In this event, a second additional metal (107') is buried in the additional hole.

24 Claims, 7 Drawing Sheets

SEMICONDUCTOR DEVICE HAVING AN ORGANIC RESIN LAYER AND SILICON OXIDE LAYER CONTAINING FLUORINE FOR PREVENTING CROSSTALK BETWEEN METAL LINES AND A METHOD OF MANUFACTURING THE SAME

BACKGROUND OF THE INVENTION

This invention relates to a semiconductor device of a multilevel or multilayer wiring structure. This invention also relates to a method of manufacturing the semiconductor device.

In recent years, a semiconductor integrated circuit becomes finer in structure. Such tendency is particularly remarkable in multilevel or multilayer wiring in a logic circuit. With an improvement in fineness of metal line spacing in the multilevel wiring, occurrence of crosstalk (a phenomenon that a signal on a line leaks onto an adjacent line) is inevitable between metal lines. In order to avoid occurrence of such crosstalk, it is proposed to use a low-dielectric-constant insulator layer as a line-to-line insulator layer between metal lines.

A technique of suppressing such crosstalk by using the Low-dielectric-constant insulator layer is disclosed, for example, in an article written by Shin-Puu Jeng et al and entitled "A Planarized Multilevel Interconnect Scheme With Embedded Low-Dielectric-Constant Polymers For Sub-Quarter-Micron Applications" contributed to 1994 Symposium on VLSI Technology Digest of Technical Papers, pp. 73–74. No effect is obtained unless a relative dielectric constant is equal to 3.5 or less.

In the current status, the relative dielectric constant is between 4 and 4.5 by the use of a P-SiO layer which is a SiO layer obtained by plasma chemical vapor deposition. It is therefore believed advantageous to use an organic layer having a relative dielectric constant between 1.8 and 3.5 instead of the P-SiO layer.

As one of the various known techniques using such organic layer, Japanese Unexamined Patent Publication No. 3-34558 (34558/1991) discloses a method of manufacturing a multilevel wiring structure. The method will herein be referred to as a first conventional method.

Another example of the various known techniques using the organic layer is disclosed in the above-mentioned Jeng et al article and will herein be referred to as a second conventional method.

Each of the first and the second conventional methods has various disadvantages which will later be described.

SUMMARY OF THE INVENTION

It is therefore an object of this invention to remove the disadvantages by providing and to provide a semiconductor device of a multilevel wiring structure which is capable of preventing occurrence of crosstalk between metal lines.

It is another object of this invention to remove the disadvantages by providing and to provide a method of manufacturing a semiconductor device of a multilevel wiring structure which is capable of preventing occurrence of crosstalk between metal lines.

According to this invention, there is provided a semiconductor device comprising: an organic layer of a resin having a relative dielectric constant between 1.8 and 3,5, both inclusive, and selected from the group consisting of a polyimide resin and a fluororesin, the organic layer having a slit; a first metal buried in the first hole; a silicon oxide layer containing fluorine and formed on the organic layer so as to have a hole on the first metal; and a second metal buried in the hole.

According to this invention, there is also provided a method of manufacturing a semiconductor device, comprising the steps of: preparing an organic layer of at resin having a relative dielectric constant between 1.8 and 3,5, both inclusive, and selected from the group consisting of a polyimide resin and a fluororesin, the organic layer having a slit; burying a first metal in the slit; forming a silicon oxide layer containing fluorine on the organic layer so that the silicon oxide layer has a hole on the first metal; and burying a second metal in the hole.

DESCRIPTION OF THE PREFERRED EMBODIMENTS

Referring to FIGS. 1A through 1H, a first conventional method using an organic layer will first be described for a better understanding of this invention. The first conventional method is equivalent to the method disclosed in the above-referred Japanese Unexamined Patent Publication No. 3-34558 (34558/1991). FIGS. 1A through 1H show a succession of steps of a multilevel wiring process required in manufacturing a two-level aluminum wiring structure according to the first conventional method.

Figure 1A:
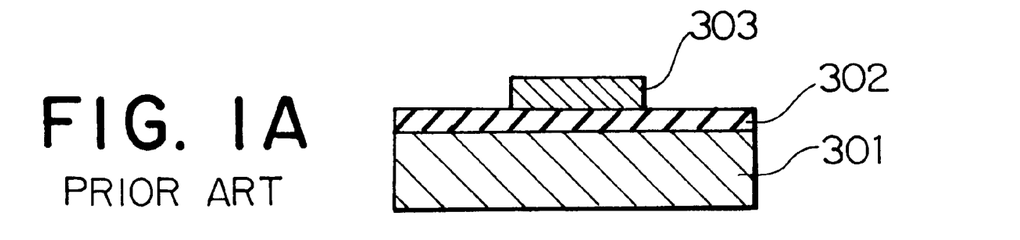
FIGS. 1A through 1H are side sectional views for describing a succession of steps of a first conventional method of manufacturing a semiconductor device.
Figure 1B:
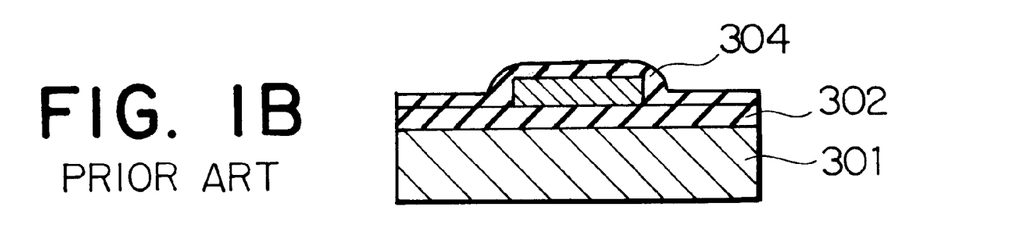

Referring to FIG. 1A, a first aluminum line 303 having a thickness of about 1 $\mu$m is formed on a semiconductor substrate 301 through an insulator layer 302. A polyimide-film-forming coating solution containing silicon is applied thereon by spin coating. Thereafter, heat treatment is carried out for 30 minutes at 150° C. within an oven in a nitrogen gas atmosphere. Thus, a silicon-containing polyimide layer 304 having a thickness of about 0.2 $\mu$m is formed as illustrated in FIG. 1B.

Figure 1C:
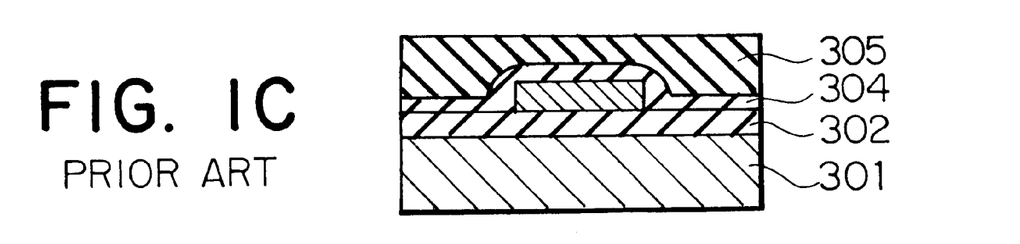

Subsequently, a dispersion of tetrafluoroethylene perfluoroalkyl vinyl ether copolymer is applied by spin coating. The dispersion is preliminarily prepared by forming fine particles of tetrafluoroethylene perfluoroalkyl vinyl ether copolymer with a diameter between 0.1 and 0.5 $\mu$m and dispersing the fine particles in pure water at a concentration of about 30 weight %. Then, heat treatment is carried out for ten minutes at 80° C. within an oven in a nitrogen gas atmosphere. Then, another heat treatment is carried out for ten minutes at 380° C. within an electric furnace in a nitrogen gas atmosphere to melt the fine particles. Thus, a fluororesin layer 305 of 1.3 $\mu$m thick is formed as illustrated in FIG. 1C.

Figure 1D:
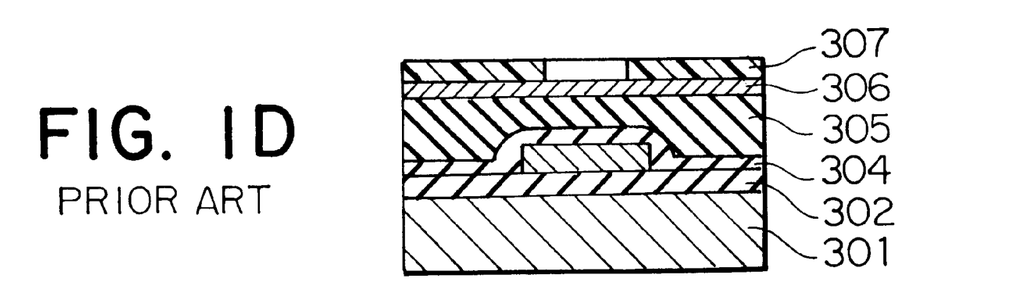
Figure 1E:
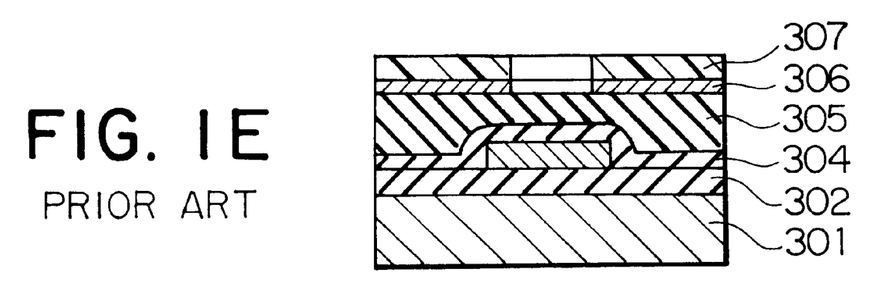
Figure 1F:
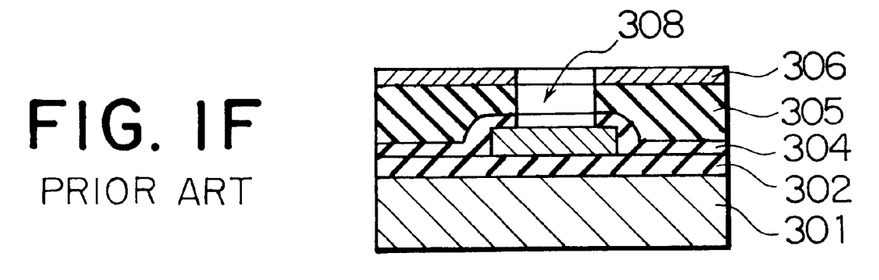

Subsequently, the surface of the fluororesin layer is exposed to argon gas plasma to be modified in quality within a sputtering apparatus. Successively within the same apparatus, a titanium layer 306 having a thickness of about 0.3 µm is formed by sputtering and a photoresist layer 307 is then formed and patterned by a known photolithography technique, as illustrated in FIG. 1D. Thereafter, as illustrated in FIG. 1E, a hole is formed in the titanium layer 306 by reactive ion etching using a mixture of $CCl_4$ gas and $SF_6$ gas. Subsequently, by reactive ion etching using a mixture of $O_2$ gas and $CF_4$ gas, a hole 308 is formed in the fluoro-resin layer and the silicon-containing polyimide layer simultaneously when the photoresist layer 307 is etched and removed, as illustrated in FIG. 1F.

Figure 1G:
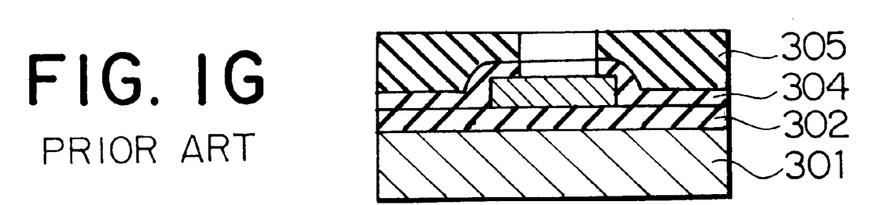
Figure 1H:
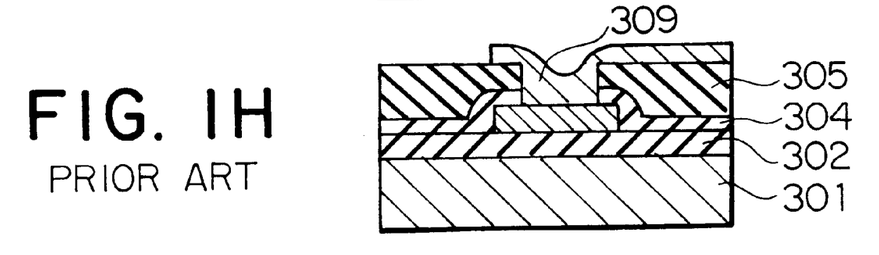

Furthermore, immersion into an aqueous solution of a mixture of ammonium and hydrogen peroxide is carried out. As illustrated in FIG. 1G, an aluminum layer of about 1 µm thick is formed by sputtering after the titanium layer 306 is removed. By the use of a known photoetching technique, a second aluminum line 309 is formed as illustrated in FIG. 1H. By repeating the above-mentioned steps, the multilevel wiring structure is formed.

Turning to FIGS. 2A through 2D, a second conventional method using an organic layer will also be described for a better understanding of this invention. The second conventional method is equivalent to the method disclosed in the above-referred Jeng et al article. FIGS. 2A through 2D are side sectional views showing a succession of steps in a multilevel wiring process required in manufacturing a two-level wiring structure according to the second conventional method.

Figure 2A:
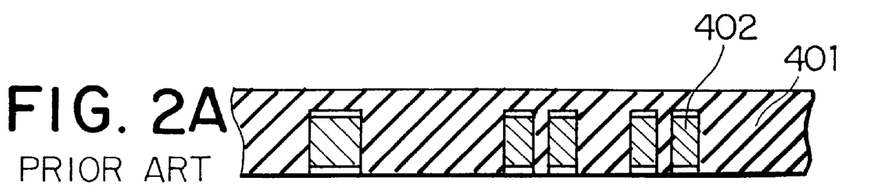
FIGS. 2A through 2D are side sectional views for describing a succession of steps of a second conventional method of manufacturing a semiconductor device.
Figure 2B:
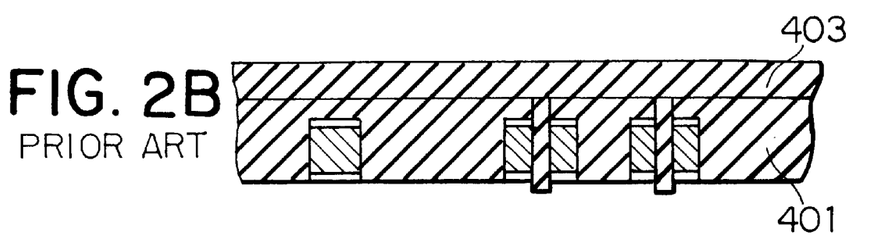
Figure 2C:
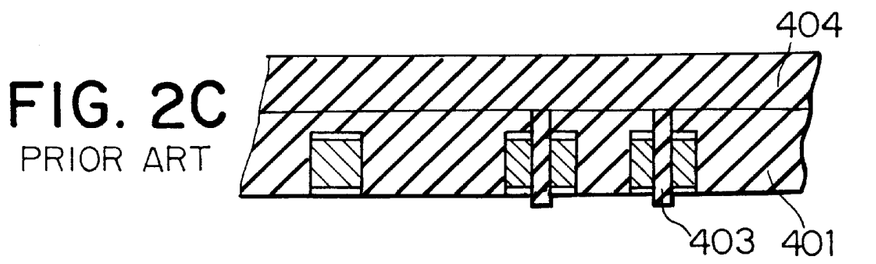
Figure 2D:
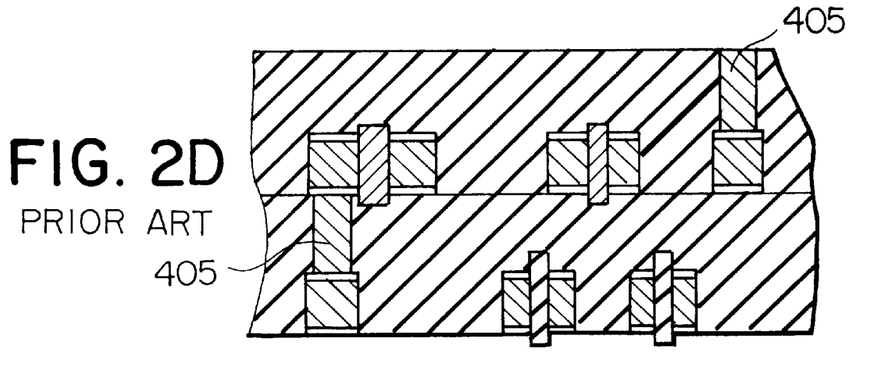

Referring to FIG. 2A, metal lines 402 are formed by etching and coated with an $SiO_2$ layer 401. Then, as illustrated in FIG. 2B, holes are formed in the $SiO_2$ layer 401 by etching narrow portions between the metal lines 402. Thereafter, a polymer layer 403 having a low dielectric constant is deposited on the $SiO_2$ layer 401 and in the holes formed therein. Subsequently, as illustrated in FIG. 2C, the polymer layer 403 is etched to leave the polymer layer 403 only in the holes formed in the $SiO_2$ layer 401. An $SiO_2$ (overlayer) layer 404 is formed thereon. A hole is formed in the $SiO_2$ layer 404 as a through hole and a via 405 is buried in the hole. By repeating the above-mentioned steps, a multilevel wiring structure is formed as illustrated in FIG. 2D.

In the above-mentioned first conventional method, the silicon-containing polyimide layer 304 is inevitably exposed from the via hole 308 after the via hole 308 is formed. Inasmuch as the silicon-containing polyimide layer 304 is highly hygroscopic, interconnect resistivity of the aluminum line (metal line) 309 of the via hole 308 is increased when the silicon-containing polyimide layer 304 is exposed. As a result, the reliability of the metal line 309 is decreased.

On the other hand, in the above-mentioned second conventional method, the polymer layer 403 of a low dielectric constant is buried in the holes formed in the $SiO_2$ layer 401. Specifically, the polymer layer 403 must be buried in the holes having a high aspect ratio and is therefore restricted to be a high-coverage layer.

In addition, in the above-mentioned second conventional method, the $SiO_2$ layer 404 is used in order to coat the organic layer 403. Since $SiO_2$ has a relative dielectric constant as relatively high as about 4, line-to-line capacitance in the vertical direction is increased. This results in decrease of a signal transmission speed between upper and lower metal layers.

In both of the first and the second conventional methods, the metal line has a selection ratio on the order of 3 with respect to the photoresist layer. Accordingly, the fine wiring process is restricted by the accuracy in patterning the photoresist layer. It is therefore difficult to accurately and finely form the metal line so that a prospective ultrafine multilevel wiring structure is achieved.

This invention removes the above-mentioned disadvantages. That is, this invention is to provide a semiconductor device of a multilevel wiring structure which is capable of preventing occurrence of crosstalk between metal lines, increase in interconnect resistivity due to moisture absorption of an interlayer insulator layer, and metal corrosion and which is highly integrated in embedding ability of the interlayer insulator layer, and to provide a method of manufacturing the semiconductor device.

FIGS. 3A through 3J show a method of manufacturing a semiconductor device according to a first embodiment of this invention.

Figure 3A:
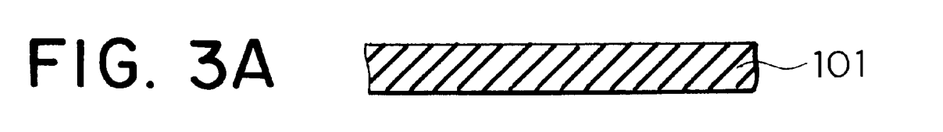
FIGS. 3A through 3J are side sectional views for describing a succession of steps of a method of manufacturing a semiconductor device according to a first embodiment of this invention.
Figure 3B:
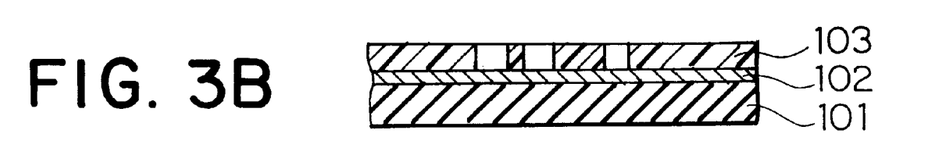
Figure 3C:
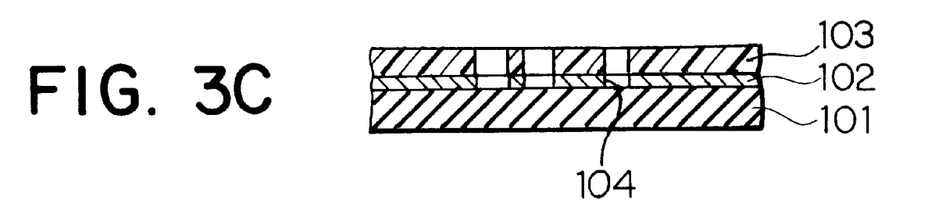
Figure 3D:
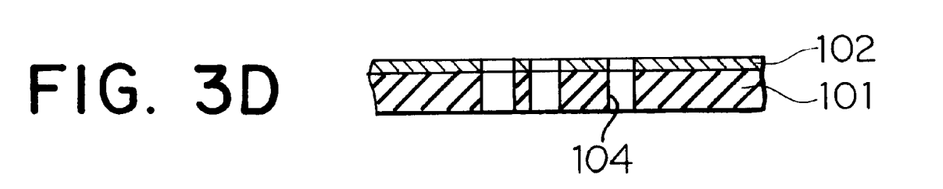
Figure 3E:
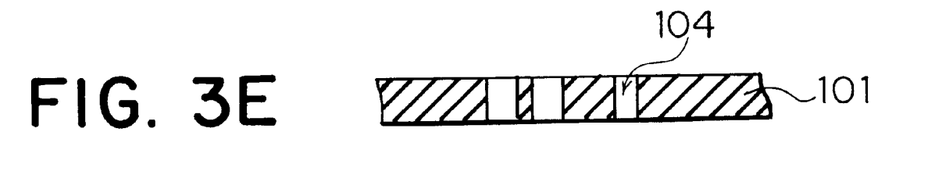
Figure 3F:
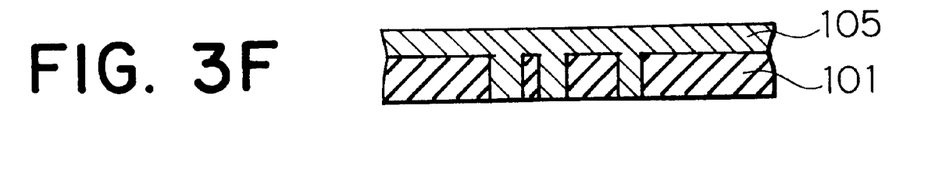
Figure 3G:
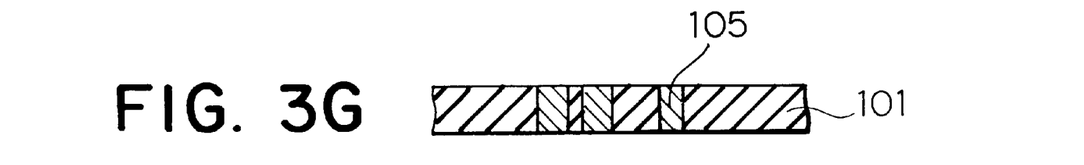
Figures 3H, 3I:
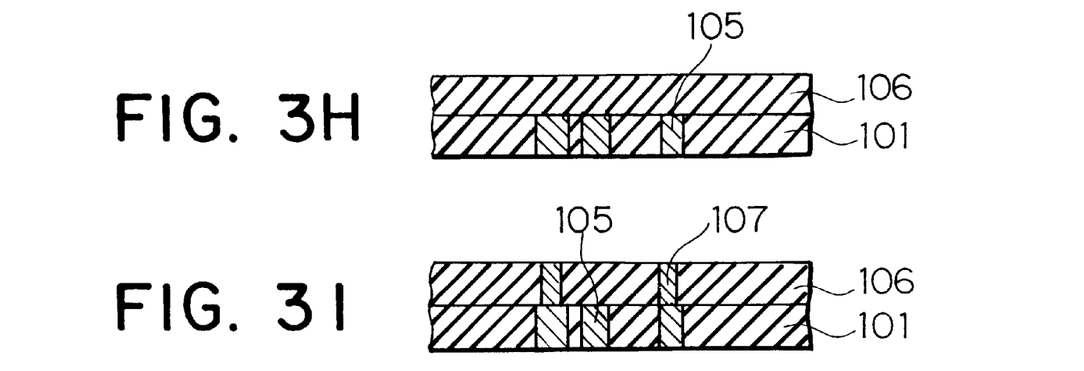
Figure 3J:
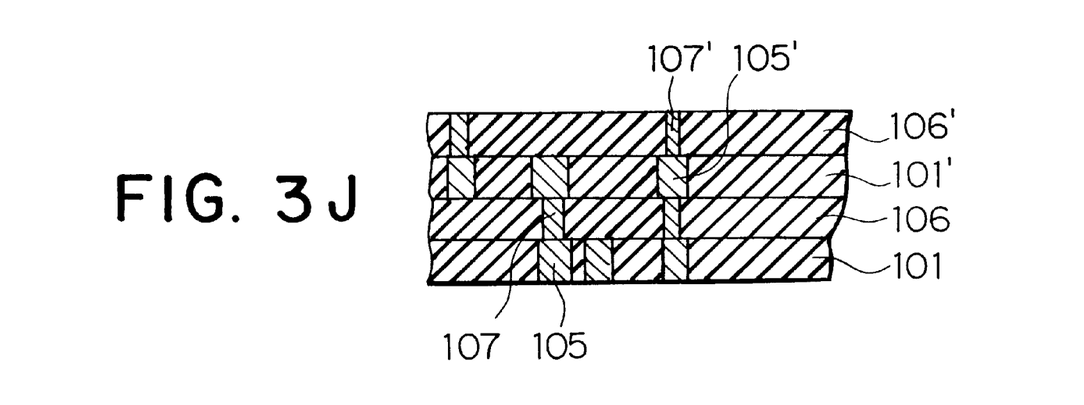

Referring to FIG. 3J, description will briefly be made as regards a structure of the semiconductor device. The semiconductor device includes an organic layer 101 of a resin which has a relative dielectric constant between 1.8 and 3,5, both inclusive, and which is selected from the group consisting of a polyimide resin and a fluororesin. The organic layer 101 has a slit which will be called a trench in the art. A first metal 105 is buried in the slit as a metal line. A silicon oxide layer 106 containing fluorine is formed on the organic layer 101 so as to have a hole on the first metal 105. A second metal 107 is buried in the hole.

An additional organic layer 101' of the resin is formed on the fluorine-containing silicon oxide layer 106 so as to have an additional slit on the second metal 107. A first additional metal 105' is buried in the additional slit as an additional metal line. An additional fluorine-containing silicon oxide layer 106' containing fluorine is formed on the additional organic layer 101' so as to have an additional hole on the first additional metal 105'. A second additional metal 107' is buried in the additional hole.

The organic layer 101 is formed first and then the slit is formed therein by, for example, reactive ion etching. Thereafter, the first metal 105 is buried in the slit. The fluorine-containing silicon oxide layer 106, which is less hygroscopic, is formed thereon. Thereafter, the hole is formed on the first metal 105. Thus, the organic layer 101 is never exposed at the hole so as to prevent increase in interconnect resistivity of the second metal 107 of the hole and corrosion of the second metal 107. In addition, since the organic layer 101 is formed first, embedding ability of the organic layer 101 is not restricted and the reliability of the device is not degraded. Since the fluorine-containing silicon oxide layer 106 having a relatively high dielectric constant is deposited on the organic layer 101, the line-to-line capacitance in the vertical direction is suppressed small so that the decrease in signal processing speed is hardly caused to occur. In addition, the first metal 105 is buried in the slit according to the above-mentioned steps. Therefore, the accuracy of the fine wiring process is further improved beyond the accuracy in forming the organic layer because the selection ratio with respect to the photoresist layer is saved.

Now, description will be made in detail as regards a method of manufacturing the semiconductor device according to the first embodiment of this invention with reference to FIGS. 3A through 3J.

Referring to FIG. 3A, a fluororesin layer 101 having a relative dielectric constant between 1.8 and 3.0 was deposited on a semiconductor substrate (not shown) by spin coating to a thickness of about 7000 angstroms. Baking was carried out for ten minutes in an $N_2$ atmosphere at a temperature between 300 and 400° C. Thereafter, the surface of the fluororesin layer 101 was exposed to argon gas plasma within a sputtering apparatus and was modified in quality. Then, successively in the same apparatus, a titanium layer 102 of 3000 angstroms thick was formed by sputtering, as illustrated in FIG. 3B.

Next, by the use of a known photolithography technique, a photoresist layer 103 was patterned as illustrated in FIG. 3B. Then, slits 104 were formed in the titanium layer 102 by reactive ion etching using a mixture of $CCl_4$ gas and $SF_6$ gas, as illustrated in FIG. 3C.

Subsequently, by reactive ion etching using a mixture of $O_2$ gas and $CF_4$ gas, the slits 104 were formed in the fluororesin layer 101 simultaneously when the photoresist layer 103 was etched and removed, as illustrated in FIG. 3D.

Then, dipping into an aqueous solution of a mixture of ammonium and hydrogen peroxide was carried out to remove the titanium layer 102 as illustrated in FIG. 3E. Thereafter, as illustrated in FIG. 3F, a blanket Cu layer (a first metal) 105 was deposited on the fluoro-resin layer 101 and the slits 104 to have a thickness of about 1 $\mu$m on the fluororesin layer 101.

Furthermore, chemical mechanical polish (CMP) was carried out for planarization to leave the Cu layer 105 only in the slits as illustrated in FIG. 3G. Thereafter, a fluorine-containing silicon oxide layer 106 containing 2–15 wt % of fluorine was formed by high-density plasma CVD using $SiF_4$ gas, $O_2$ gas, and Ar gas, as illustrated in FIG. 3H.

Subsequently, by the use of a known photolithography technique, another photoresist layer 103 was formed and patterned. Then, by reactive ion etching using a mixture of $CF_4$ gas and $O_2$ gas, holes were formed in the fluorine-containing silicon oxide layer 106. Thereafter, the photoresist layer 103 was removed and Al plugs (second metal) 107 were grown within the holes, as illustrated in FIG. 3H. By repeating these steps, a multilevel wiring structure is formed as illustrated in FIG. 3J.

Turning to FIGS. 4A through 4I, description will be made as regards a method of manufacturing a semiconductor device according to a second embodiment of this invention.

The second embodiment is different from the first embodiment in that the metal layer (titanium layer 102) used as a mask member in the step of forming the slits 104 in the fluororesin layer 101 is replaced by a fluorine-containing silicon oxide layer 202. A resultant advantage is that the mask member is left unremoved and therefore the steps of removing the metal and etching a single layer of the fluororesin layer 101 in the first embodiment can be omitted. In the first embodiment, the accuracy is insufficient upon finely patterning the mask because the metal layer has a selection ratio as small as about 3 with respect to the photoresist layer. In the second embodiment on the other hand, a photoresist layer for an insulator layer has a selection ratio as large as between 7 and 8 so that the accuracy is improved.

Figure 4A:
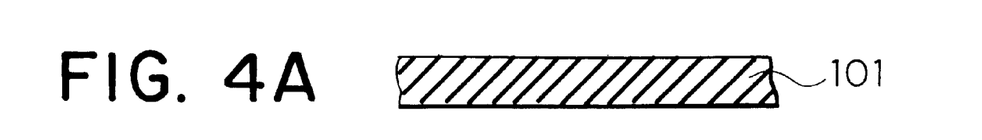
FIGS. 4A through 4I are side sectional views for describing a succession of steps of a method of manufacturing a semiconductor device according to a second embodiment of this invention.

In the second embodiment, the fluororesin layer 101 was formed first and baking was then carried out to form a structure illustrated in FIG. 4A. Thereafter, a fluorine-containing silicon oxide layer 202 was deposited to a thickness of 3000 angstroms as illustrated in FIG. 4B.

Figure 4B:
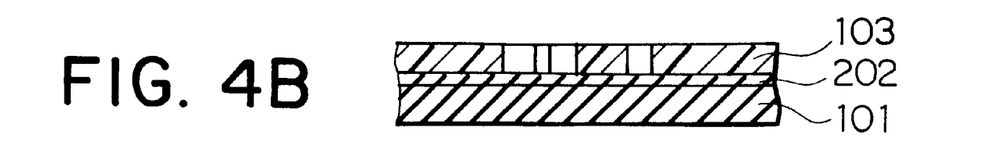
Figure 4C:
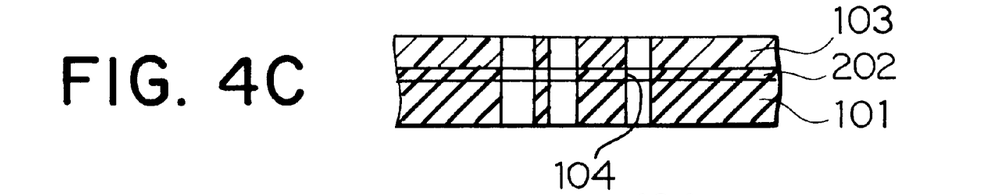
Figure 4D:
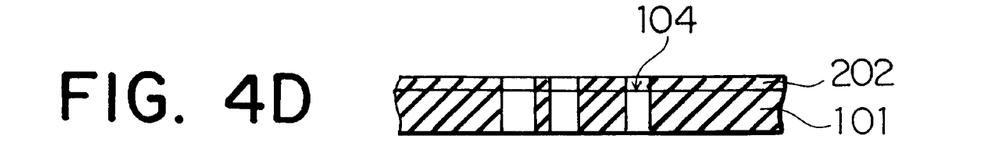
Figure 4E:
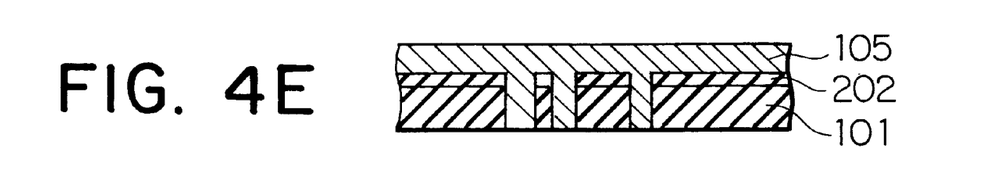
Figure 4F:
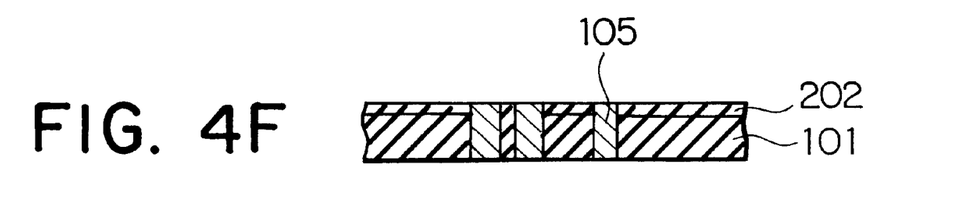
Figure 4G:
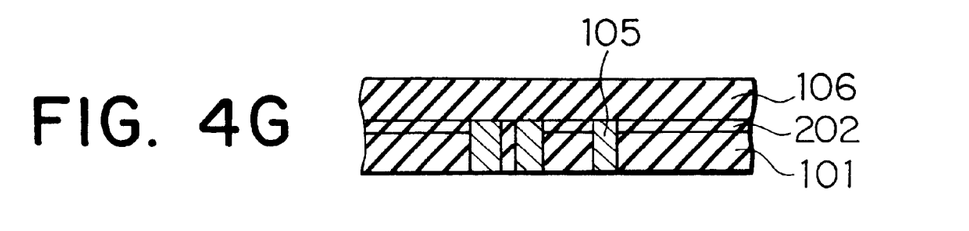
Figure 4H:
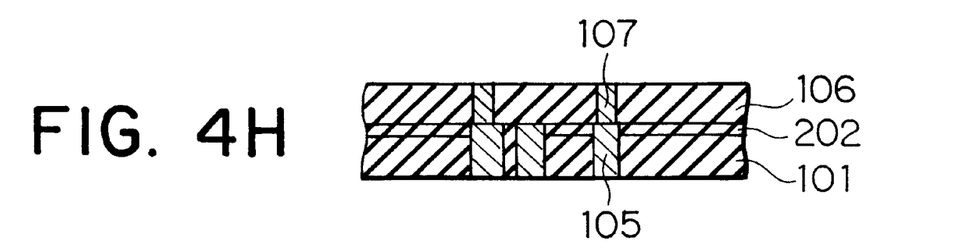
Figure 4I:
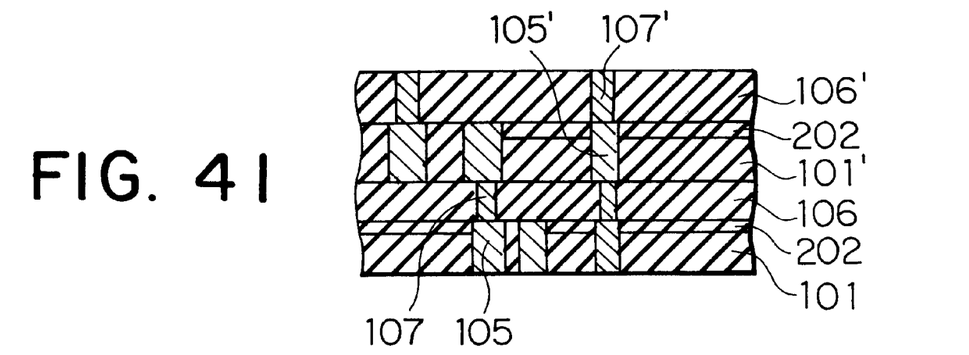

Next, by the use of a known photolithography technique, the photoresist layer 103 was patterned as illustrated in FIG. 4B. Thereafter, a stack of the fluorine-containing silicon oxide layer 202 and the fluororesin in layer 101 were simultaneously patterned by reactive ion etching using a mixture of $O_2$ gas and $CF_4$ gas to form the slits 104 as illustrated in FIG. 4C. Subsequently, as illustrated in FIG. 4D, the photoresist layer 103 alone was removed. Then, the steps in FIGS. 4E through 4H were carried out which are similar to the step in FIGS. 3F through 3I in the first embodiment. Finally, by repeating the above-mentioned steps, a multilevel wiring structure having Cu layers (first metals) 105 and Al plugs (second metals) 107 was formed as illustrated in FIG. 4I.

In the first and the second embodiments described above, the fluororesin layer 101 is used as the organic layer. Alternatively, a polyimide resin layer can be used. As the mask member to form the grooves in the organic layer, use is made of the titanium layer 102 in the first embodiment. Alternatively, use may be made of at least one of various metal layers including a tungsten layer, a titanium-containing tungsten layer, a molybdenum layer, an aluminum layer, and an aluminum alloy layer. In the second embodiment, the fluorine-containing silicon oxide layer 202 is used. Instead, use may be made of at least one of various inorganic layers, including a silicon oxide layer, a silicon nitride layer, and a silicon oxide nitride layer, formed by plasma chemical vapor deposition or sputtering. In addition, the surface of the organic layer such as the fluororesin layer may be modified by the use of reactive ion etching using $CF_4$ gas or $O_2$ gas.

On the other hand, attention will be directed to the first metals 105 and 105' and the second metals 107 and 107'. In the first and the second embodiments, the Cu layer is used as the first and the second metals 105, 105', 107, and 107', respectively. It is noted here that each of Cu and Al can be used for either of the first and the second metals. Alternatively, a different metal layer such as W, Au, or the like can be used. In order to improve the reliability of the first and second metals, Pd, Cu, Si, and the like can be included. In addition, depending upon the metal material, a single layer of Ti, TiN, TiW, or poly-Si or a combination thereof can be used as a barrier layer.

On the other hand, in order to form the organic layers 101 and 101', the first and the second embodiments adopt spin coating followed by baking. Instead, deposition by plasma CVD can be used. In the first and the second embodiments, each of the fluorine-containing silicon oxide layers 106 and 106' is formed by the high-density plasma CVD using $SiF_4$ gas, $O_2$ gas, and Ar gas. Instead, parallel-plate plasma CVD may be used. In addition, the $SiF_4$ may be replaced by a combination of $SiH_4$ and an additive gas selected from $C_2F_6$, $CF_4$, $NF_3$, and $SF_6$, or a combination of TEOS (tetra-ethyl orthosilicate) and an additive gas selected from $C_2F_6$, $CF_4$, $NF_3$, and $SF_6$. Alternatively, FTES (fluorotriethoxy silane) may be used. It is noted here that $O_2$ can be replaced by one of $N_2O$, NO, $CO_2$, CO, $O_3$, and $H_2O$ and that Ar is not necessarily be added.

As described above, in the semiconductor device and the method of manufacturing the same according to this invention, it is possible to prevent occurrence of crosstalk between the metal lines, increase in interconnect resistivity due to moisture absorption of an interlayer insulator, and metal corrosion and to improve the reliability with the highly integrated embedding ability of the interlayer layer. These advantages will hereafter be specifically mentioned.

(1) The multilevel wiring structure without exposure of the organic layer at the via hole effectively prevents increase in interconnect resistivity of the via hole. Therefore, the reliability of the metal lines is improved.

(2) Since the organic layer is formed prior to formation of the metal lines, the hole metal structure need not be adopted to improve embedding ability of the organic layer. It is therefore possible to prevent decrease in reliability of the device due to occurrence of void.

(3) Because the SiOF layer is interposed between the metals in the vertical direction, the relative dielectric constant is decreased to a value between 3.0 and 3.7 (between 4 and 4.5 with the $SiO_2$ layer used in the above-mentioned another conventional example). Therefore, a delay is present in signal processing speed between the upper and the lower metal lines so that about 10% decrease of crosstalk is realized when a line width is equal to 0.6 µm for example.

(4) Since the organic layer is formed prior to formation of the metal lines and the groove is thereafter formed, the margin is further widened. This is because the limit in finely processing the insulator layer is superior as compared with the metal line. Accordingly, very fine metal lines can be formed without taking the limit in metal processing into consideration.

What is claimed is:

1. A semiconductor device comprising:
   a first organic resin layer having a dielectric constant not less than 1.8 and not greater than 3.5, and selected from the group consisting of a polyimide resin and a fluororesin, said first organic layer having a plurality of first slits;
   a first silicon oxide layer containing fluorine, formed on said first organic layer and patterned to have a plurality of second slits coincident with said plurality of first slits in said first organic layer so as to provide a mask layer for forming said plurality of first slits in said first organic layer;
   a first conductive material buried in said plurality of first slits and plurality of second slits for forming a first interconnection layer;
   a second silicon oxide layer containing fluorine and formed on said first silicon oxide layer so as to have a first hole on said first conductive material formed within at least one of said plurality of first slits and respective second slit; and
   a second conductive material buried in said first hole.

2. A semiconductor device as claimed in claim 1, further comprising:
   a second organic layer of said resin, said second organic layer being formed on said second silicon oxide layer so as to have a plurality of third slits, at least one of said third slits formed on said second conductive material; and
   a third conductive material buried in said plurality of third slits for forming a second interconnection layer.

3. A semiconductor device as claimed in claim 2, further comprising:
   a third silicon oxide layer containing fluorine and formed on said second organic so as to have a second hole on said third conductive material formed within at least one of said plurality of third slits; and
   a fourth conductive material buried in said second hole.

4. A semiconductor device as claimed in claim 3, wherein said second hole is narrower than said plurality of third slits so that said second organic layer is never exposed by said second hole.

5. A semiconductor device as claimed in claim 3, wherein said second silicon oxide layer and said third silicon oxide layer each have a fluorine content of not less than 2 wt % and not greater than 15 wt %.

6. The semiconductor device as claimed in claim 3, wherein said third conductive material comprises copper and said fourth conductive material comprises aluminum.

7. The semiconductor device as claimed in claim 3, wherein said third silicon oxide layer does not contact said first or second silicon oxide layers.

8. A semiconductor device as claimed in claim 1, wherein said first hole is narrower than said plurality of first slits and plurality of second slits so that said first organic layer is never exposed by said first hole.

9. A semiconductor device as claimed in claim 1, wherein said first silicon oxide layer has a fluorine content of not less than 2 wt % and not greater than 15 wt %.

10. A semiconductor device as claimed in claim 1, wherein said second silicon oxide layer has a fluorine content of not less than 2 wt % and not greater than 15 wt %.

11. The semiconductor device as claimed in claim 1, wherein said first conductive material is different from said second conductive material.

12. The semiconductor device as claimed in claim 11, wherein said first conductive material comprises copper and said second conductive material comprises aluminum.

13. The semiconductor device as claimed in claim 1, wherein said first organic resin layer is formed on a semiconductor substrate and said first silicon oxide layer does not contact said semiconductor substrate.

14. The semiconductor device as claimed in claim 1, wherein an entire surface on which said second silicon oxide layer is formed is planar.

15. A semiconductor device comprising:
   an organic layer of a resin having a relative dielectric constant between 1.8 and 3.5, both inclusive, and selected from the group consisting of a polyimide resin and a fluororesin;
   a first metal buried in a pre-existing slit in said organic layer;
   a silicon oxide layer containing fluorine and formed on said organic layer so as to have a hole on said first metal; and
   a second metal buried in said hole;
   wherein said first metal is different from said second metal; and
   wherein said first metal comprises copper and said second metal comprises aluminum.

16. A semiconductor device comprising:
   an organic layer of a resin having a relative dielectric constant between 1.8 and 3.5, both inclusive, and selected from the group consisting of a polyimide resin and a fluororesin;
   a first metal buried in a pre-existing slit in said organic layer;
   a silicon oxide layer containing fluorine and formed on said organic layer so as to have a hole on said first metal; and
   a second metal buried in said hole;
   wherein said organic layer is formed on a semiconductor substrate and said silicon oxide layer does not contact said semiconductor substrate.

17. A semiconductor device comprising:
   an organic layer of a resin having a relative dielectric constant between 1.8 and 3.5, both inclusive, and selected from the group consisting of a polyimide resin and a fluororesin;
   a first metal buried in a pre-existing slit in said organic layer;
   a silicon oxide layer containing fluorine and formed on said organic layer so as to have a hole on said first metal; and a second metal buried in said hole;

wherein an entire surface on which said silicon oxide layer is formed is planar.

18. A semiconductor device comprising:

an organic layer of a resin having a relative dielectric constant between 1.8 and 3.5, both inclusive, and selected from the group consisting of a polyimide resin and a fluororesin;

a first metal buried in a pre-existing slit in said organic layer;

a silicon oxide layer containing fluorine and formed on said organic layer so as to have a hole on said first metal;

a second metal buried in said hole;

an additional organic layer of said resin, said additional organic layer being formed on said silicon oxide layer so as to have an additional slit on said second metal;

a first additional metal buried in said additional slit;

an additional silicon oxide layer containing fluorine and formed on said additional organic layer so as to have an additional hole on said first additional metal; and a second additional metal, different from said first additional metal, buried in said additional hole;

wherein said first additional metal comprises copper and said second additional metal comprises aluminum.

19. A semiconductor device comprising:

an organic layer of a resin having a relative dielectric constant between 1.8 and 3.5, both inclusive, and selected from the group consisting of a polyimide resin and a fluororesin;

a first metal buried in a pre-existing slit in said organic layer;

a silicon oxide layer containing fluorine and formed on said organic layer so as to have a hole on said first metal;

a second metal buried in said hole;

an additional organic layer of said resin, said additional organic layer being formed on said silicon oxide layer so as to have an additional slit on said second metal;

a first additional metal buried in said additional slit;

an additional silicon oxide layer containing fluorine and formed on said additional organic layer so as to have an additional hole on said first additional metal; and a second additional metal, different from said first additional metal, buried in said additional hole;

wherein said additional silicon oxide layer does not contact said silicon oxide layer.

20. A semiconductor device comprising:

an organic layer of a resin having a relative dielectric constant between 1.8 and 3.5, both inclusive, and selected from the group consisting of a polyimide resin and a fluororesin;

a first metal buried in a pre-existing slit in said organic layer;

a silicon oxide layer containing fluorine and formed on said organic layer so as to have a hole on said first metal;

a second metal buried in said hole;

an additional organic layer of said resin, said additional organic layer being formed on said silicon oxide laser so as to have an additional slit on said second metal;

a first additional metal buried in said additional slit;

an additional silicon oxide layer containing fluorine and formed on said additional organic layer so as to have an additional hole on said first additional metal; and a second additional metal, different from said first additional metal, buried in said additional hole;

wherein an entire surface on which said additional silicon oxide layer is formed is planar.

21. A semiconductor device comprising:

an organic resin layer having a relative dielectric constant not less than 1.8 and not greater than 3.5, and selected from the group consisting of a polyimide resin and a fluororesin;

a first conductive layer buried in a pre-existing slit in said organic resin layer;

a silicon oxide layer containing fluorine and formed on said organic resin layer so as to have a hole on said first conductive layer; and a second conductive layer, having a composition different from that of said first conductive layer, buried in said hole;

wherein said organic resin layer is formed on a semiconductor substrate and said silicon oxide layer does not contact said semiconductor substrate.

22. A semiconductor device comprising:

an organic resin layer having a relative dielectric constant not less than 1.8 and not greater than 3.5, and selected from the group consisting of a polyimide resin and a fluororesin;

a first conductive layer buried in a pre-existing slit in said organic resin layer;

a silicon oxide layer containing fluorine and formed on said organic resin layer so as to have a hole on said first conductive layer; and a second conductive layer, having a composition different from that of said first conductive layer, buried in said hole;

wherein an entire surface on which said silicon oxide layer is formed is planar.

23. A semiconductor device comprising:

an organic resin layer having a relative dielectric constant not less than 1.8 and not greater than 3.5, and selected from the group consisting of a polyimide resin and a fluororesin;

a first conductive layer buried in a pre-existing slit in said organic resin layer;

a silicon oxide layer containing fluorine and formed on said organic resin layer so as to have a hole on said first conductive layer;

a second conductive layer, having a composition different from that of said first conductive layer, buried in said hole;

an additional organic resin layer, said additional organic layer being formed on said silicon oxide layer so as to have an additional slit on said second conductive layer;

a first additional conductive layer buried in said additional slit;

an additional silicon oxide layer containing fluorine and formed on said additional organic resin layer so as to have an additional hole on said first additional conductive layer; and a second additional conductive layer having a composition different from that of said first additional conductive layer buried in said additional slit;

wherein said additional silicon oxide layer does not contact said silicon oxide layer.

24. A semiconductor device comprising:

an organic resin layer having a relative dielectric constant not less than 1.8 and not greater than 3.5, and selected from the group consisting of a polyimide resin and a fluororesin;

a first conductive layer buried in a pre-existing slit in said organic resin layer;

a silicon oxide layer containing fluorine and formed on said organic resin layer so as to have a hole on said first conductive layer;

a second conductive layer, having a composition different from that of said first conductive layer, buried in said hole;

an additional organic resin layer, said additional organic layer being formed on said silicon oxide layer so as to have an additional slit on said second conductive layer;

a first additional conductive layer buried in said additional slit;

an additional silicon oxide layer containing fluorine and formed on said additional organic resin layer so as to have an additional hole on said first additional conductive layer; and a second additional conductive layer having a composition different from that of said first additional conductive layer buried in said additional slit;

wherein an entire surface on which said additional silicon oxide layer is formed is planar.

* * * * *